United States Patent
Rodriguez et al.

(10) Patent No.: US 7,701,308 B1
(45) Date of Patent: Apr. 20, 2010

(54) RADIO FREQUENCY MODULATOR

(75) Inventors: Istvan Rodriguez, Chelsea, MA (US);
Robert A. Lindquist, Jr., Hopkinton, MA (US)

(73) Assignee: Raytheon Company, Waltham, MA (US)

( * ) Notice: Subject to any disclaimer, the term of this patent is extended or adjusted under 35 U.S.C. 154(b) by 39 days.

(21) Appl. No.: 12/267,664

(22) Filed: Nov. 10, 2008

(51) Int. Cl.
 *H03K 7/00* (2006.01)
(52) U.S. Cl. ...................................... 332/107
(58) Field of Classification Search ............... 332/106, 332/107, 117, 123–128, 149, 159–162
See application file for complete search history.

(56) References Cited

U.S. PATENT DOCUMENTS 7,183,856 B2 * 2/2007 Miki et al. .................. 330/297

* cited by examiner

*Primary Examiner*—David Mis
(74) *Attorney, Agent, or Firm*—Daly, Crowley, Mofford & Durkee, LLP

(57) ABSTRACT

A radio frequency modulator system having a radio frequency amplifier controlled by a pulse modulator. The pulse modulator includes: a first switching circuit response to an input pulse for coupling a dc voltage relative to a reference potential to the output electrode when the radio frequency signal is to be amplified by the radio frequency amplifier and for decoupling the dc voltage from the output electrode when the radio frequency signal is to be decoupled from the output electrode wherein charge is stored in the storage element when the dc voltage is coupled to the output electrode; and: a second switching circuit responsive to the input pulse for discharging the stored charge when the dc voltage is decoupled from the output electrode.

6 Claims, 3 Drawing Sheets

RADIO FREQUENCY MODULATOR

TECHNICAL FIELD

This invention relates generally to radio frequency modulators and more particularly to radio frequency modulator adapted to pulse "on" and "off" an amplifier for amplifying a radio frequency signal fed to such amplifier.

BACKGROUND

As is known in the art, radio frequency modulators have a wide range of applications. One is in radar system where the radio frequency modulator is adapted to pulse "on" and "off" an amplifier for amplifying a radio frequency signal fed to such amplifier. One such modulator is shown in FIG. 1. Here a radio frequency signal is fed to a power amplifier (PA) for amplification when such amplifier is powered "on" by a modulator. The modulator is fed a dc pulse. When the pulse is "high", here at +3.3 volts, the pulse is fed through an R-C speed up network to the base electrode of a bipolar transistor (BT) turning a FET "on" thereby coupling a dc voltage, here +30 volts, to turn the power amplifier "on".

SUMMARY

In accordance with the present invention, a radio frequency modulator system is provided having a radio frequency amplifier controlled by a pulse modulator. The pulse modulator includes a first switching circuit response to an input pulse for coupling a dc voltage relative to a reference potential to the output electrode when the radio frequency signal is to be amplified by the radio frequency amplifier and for decoupling the dc voltage from the output electrode when the radio frequency signal is to be decoupled from the output electrode wherein charge is stored in the storage element when the dc voltage is coupled to the output electrode. A second switching circuit is responsive to the input pulse for discharging the stored charge when the dc voltage is decoupled from the output electrode.

The inventors have recognized the need to discharge the stored charge and have provided a separate discharge circuit, i.e., the second switching network.

In one embodiment, the first switching circuit comprises: a first network fed by the input pulse; a first transistor having a control electrode fed by the input pulse through the first network; a second transistor having a first electrode coupled to the dc power supply, a second electrode coupled to the output electrode, and a control electrode coupled to an output electrode of the first transistor. The second switch network comprises: a second network; a third transistor having a first electrode coupled to the reference potential, a second electrode fed by the input pulse through the second network; and a fourth transistor having a first electrode coupled to the reference potential, a second electrode coupled to the output electrode of the amplifier transistor and a control electrode coupled to a third electrode of the third transistor.

In one embodiment, the first transistor is matched to the third transistor.

In one embodiment, the first network has the same configuration as the second network.

With such an arrangement, the turning "on" of the first and third transistors are synchronized.

In one embodiment, the first switching circuit comprises a first network and a second network. The first network is fed by the input pulse. The first transistor has a control electrode fed by the input pulse through the first network. A second transistor has a first electrode coupled to the dc voltage, a second electrode coupled to the output electrode, and a control electrode coupled to the output electrode of the first transistor through a transistor push-pull network. The second switch network comprises: a second network; a third transistor having a first electrode coupled to the reference potential, a second electrode fed by the input pulse through the second network; and a fourth transistor having a first electrode coupled to the reference potential, a second electrode coupled to the output electrode of the amplifier transistor and a control electrode coupled to a third electrode of the third transistor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
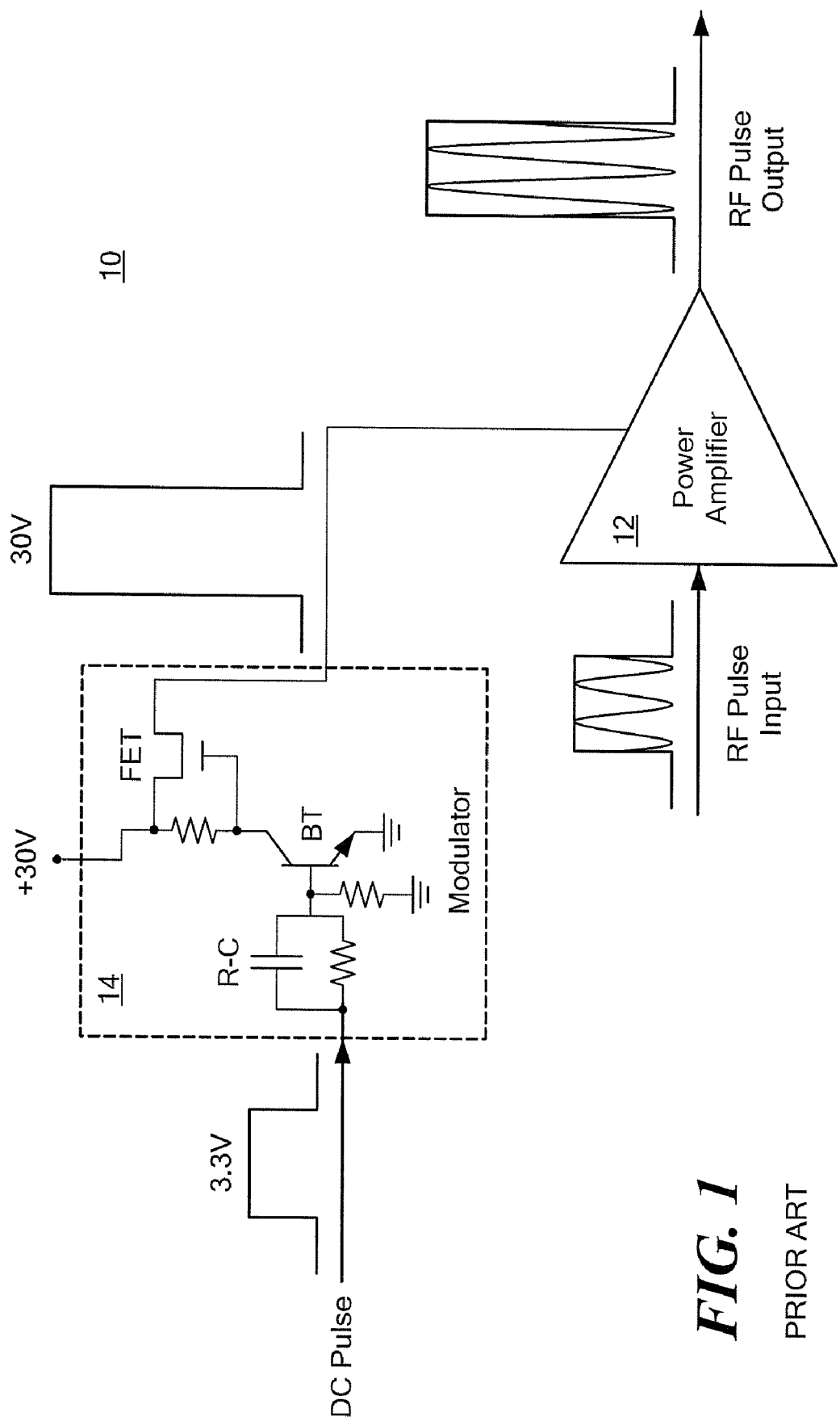
FIG. 1 is a block diagram of a radio frequency modulator system according to the PRIOR ART.

Referring now to FIG. 1, a radio frequency (RF) modulator system 10 is shown having a MMIC radio frequency amplifier 12 controlled by a pulse modulator 14.

The amplifier 12 includes a amplifier transistor 16 (FIG. 2), here a GaN FET, having a control (here gate) electrode fed by a radio frequency signal, here a pulsed radio frequency signal (FIG. 1), for example and; energy storage elements, here capacitors such as bypass and blocking or tuning capacitors 18 (FIG. 2), arranged in a conventional manner, as shown. The amplifier transistor 16 has an output (here drain) electrode 20 (FIGS. 1 and 2) for producing an amplification of the radio frequency signal when a dc voltage at terminal 19, here +30 volts, relative to a reference potential, here ground potential, is coupled to such output electrode 20.

Figure 2:
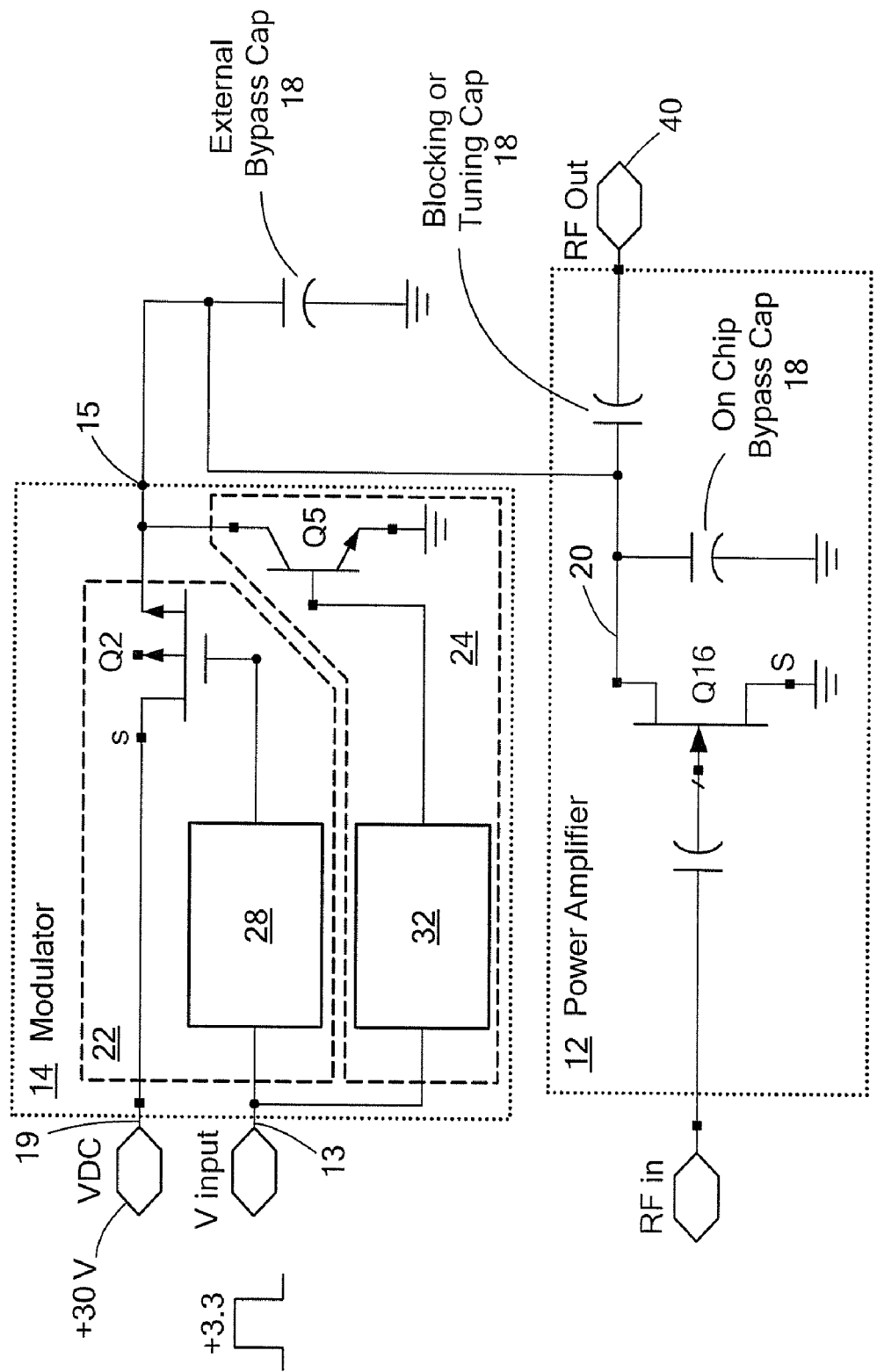
FIG. 2 is a schematic diagram of a radio frequency modulator system according to the invention.

The pulse modulator 14 is responsive to a input dc pulse, here a +3.3 volt pulse fed to input terminal 13, and produces at the output thereof higher voltage pulse, here a +30 volt pulse at output terminal 15, as shown in FIG. 2, such higher voltage pulse being fed to the output electrode 20 of transistor 16, as shown in FIG. 2.

More particularly, referring to FIG. 2, a dc voltage, here +30 Volts relative to ground is fed to terminal 19 to power the modulator 14. When a pulse, here a +3.3 volt pulse, is fed to line 13, the pulse is coupled through a first network 28, to be described in detail in FIG. 3, to a transistor Q1 "on" thereby coupling the +30 volts at terminal 19 to the amplifier 12 to thereby turn the amplifier 12 "on" and thereby amplifying the RF signal fed to the amplifier 12. It is noted that charge is stored in the storage elements 18 (FIG. 2) when the +30 volt dc voltage at terminal 19 is coupled to the output electrode 20 of amplifier transistor 16 (FIG. 2).

Figure 3:
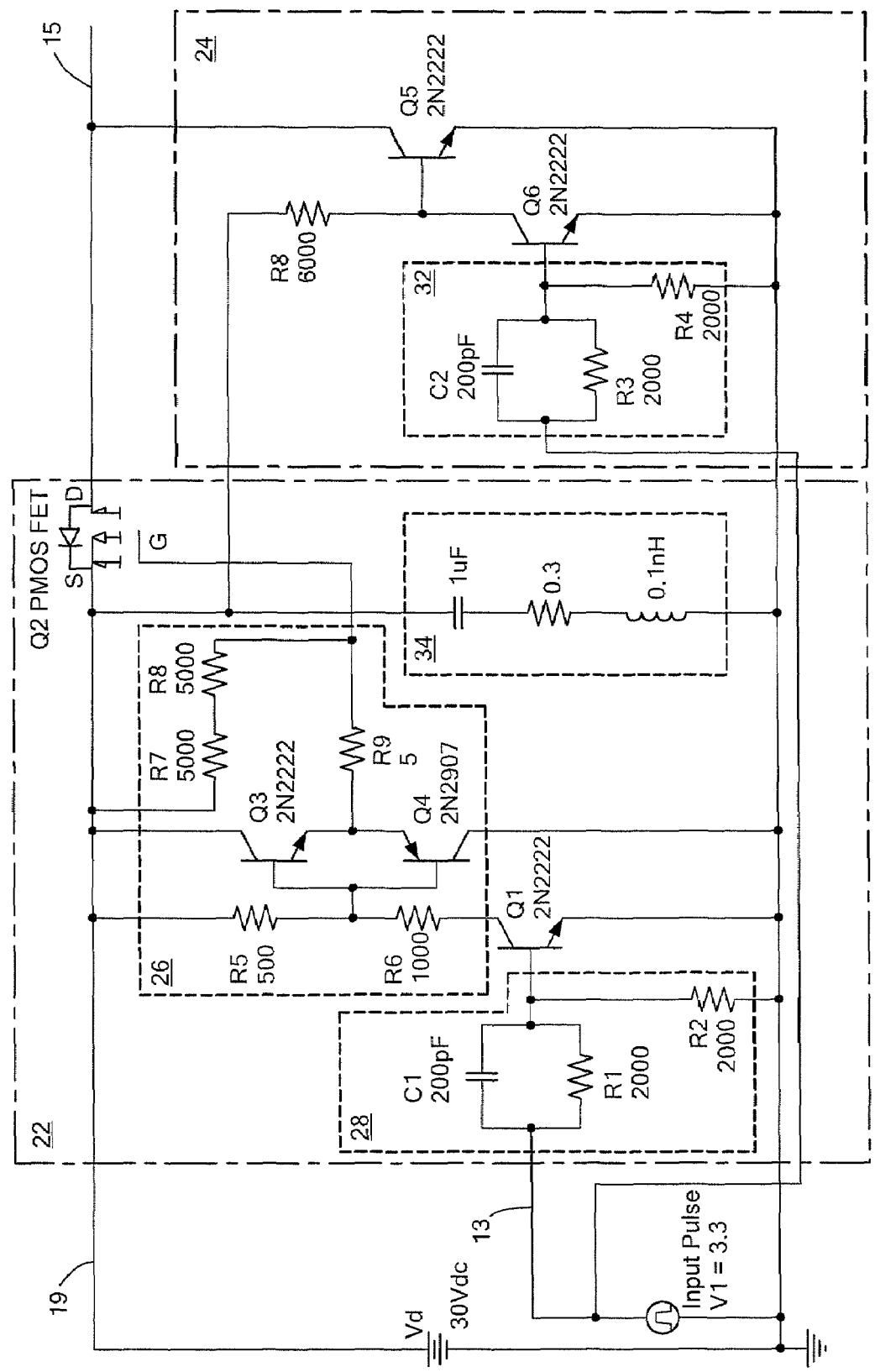
FIG. 3 is a schematic diagram of a pulse modulator used in the radio frequency modulator system of FIG. 2 according to the invention.

When the +3.3 volt pulse is removed from line 13, i.e., the voltage on line 13 goes from +3.3 volts towards ground potential, the first network 28 turns transistor Q2 "off" thereby decoupling the +30 volt dc voltage at terminal 19 from the output electrode 20, and a second network 32, to be described in detail in FIG. 3, turns a previously "off" transistor Q5 "on" thereby discharging stored charge on storage elements 18 (FIG. 2).

Referring now also to FIG. 3, the pulse modulator 14 (FIG. 1) includes a first switching circuit 22 response to the 3.3 volt input pulse at terminal 13 for coupling the +30 volt dc voltage relative to a reference potential at terminal 19 to output terminal 15 and therefore to the output electrode 20 of amplifier transistor 16 (FIG. 2) when the radio frequency signal is to be amplified by the radio frequency amplifier 12 (FIGS. 1 and 2) and for decoupling the +30 volt dc voltage at terminal 19 from the output electrode 20 when the radio frequency signal is to be decoupled from the output electrode 20 of amplifier transistor 16 (FIG. 2) wherein charge is stored in the storage elements 18 (FIG. 2) when the +30 volt dc voltage at terminal 19 is coupled to the output electrode 20 of amplifier transistor 16 (FIG. 2). A second switching circuit 24 (FIG. 3) is responsive to the input pulse at terminal 13 (FIGS. 1, 2 and 3) for discharging the stored charge when the +30 volt dc voltage at terminal 19 is decoupled from the output electrode 20 of amplifier transistor 16 (FIG. 2).

The first switching circuit 22 (FIG. 3) includes the first network 28 fed by the input pulse on line 13; a first transistor Q1 having a control (here base) electrode fed by the input pulse on line 13 through the first network 28; the second transistor Q2 having a first electrode (here source) coupled to the dc power supply at terminal 19, a second electrode (here drain) coupled to the output electrode Q16 (FIG. 2) via line 15, and a control (here gate) electrode coupled to an output (here collector) electrode of the first transistor Q1, as shown.

The second switch network 24 includes the second network 32; a third transistor Q6 having a first (here emitter) electrode coupled to the reference potential (ground), a control electrode (here base) fed by the input pulse on line 13 through the second network 32; and a fourth transistor Q5 having a first electrode (here emitter) coupled to the reference potential (ground), a second (here collector) electrode coupled to the output electrode 20 (FIG. 2) of the amplifier transistor Q16 and a control (here base) electrode coupled to a third (here collector) electrode of the third transistor Q6.

More particularly, the first network 28 is fed by the input pulse at terminal 13; the first transistor Q1, here an NPN transistor has a control (here base) electrode fed by the input pulse through the first switching circuit 22; the second transistor Q2, here a PMOS FET, has a first electrode (here source) coupled to the +30 volt dc voltage at terminal 19, a second (here drain) electrode coupled to the output terminal 15 and hence to the output electrode 20 of amplifier transistor 16 (FIG. 2), and a control (here gate) electrode coupled to an output electrode of the first transistor Q1, through a push-pull configuration 26 having transistors Q3 and Q4, that sets the required gate electrode voltage of the PMOS FET, as shown.

The second switching circuit 24 comprises: the second network 32; and the fifth transistor Q5, here an NPN transistor, having a first (here emitter) electrode coupled to the reference potential (here ground), a second electrode (here collector) coupled to the output electrode 20 of the amplifier transistor 16 (FIG. 2). The second switch network 24 includes the sixth transistor Q6 having a control electrode fed by the input pulse on line 13 through the second network 32, a first electrode coupled to the reference potential (ground), and a third electrode coupled to the control electrode of the fifth transistor Q5, as shown.

The first transistor Q1 is matched to the sixth transistor Q6.

The first network 28 has the same configuration as the second network 32. More particularly, the first network 28 includes a resistor R1 parallel to capacitor C1 in series with resistor R2, and the second network 32 includes resistor R3 parallel to capacitor C2 in series with resistor R4. Here resistors R1-R4 are each 2000 ohms and capacitors C1 and C2 are 200 pf.

The first switching circuit 22 includes biasing resistors R5-R9 arranged as shown. The first switching circuit 22 includes a low Equivalent Series Resistance (ESR) capacitor 34, shown in FIG. 3 by its equivalent model (1 uF, 0.35Ω, 0.1 nH), placed in close proximity to the source electrode of transistor Q2, and the PMOS FET Q2, to mitigate any inductance from input terminal 19 to the source electrode of the transistor Q2.

In operation, when the input pulse at terminal 13 is high, i.e., here +3.3 volts, transistor Q1 turns "on" rapidly assisted by the sped up action of capacitor C1 thereby turning transistor Q2 "on" and transistor Q5 "off". Thus, the required voltage now at the gate of transistor Q2 turns transistor Q2 "on" to thereby couple the "+30 volts at terminal 19 through transistor Q2 to output terminal 15 and thus to the output terminal 20 of the amplifier transistor 16 (FIG. 2). The +30 volts of the drain electrode of transistor 16 turns such transistor 16 "on" thereby coupling the RF input to the output electrode 40. It is first noted that the when the input pulse at terminal 13 is high, i.e., here +3.3 volts, transistor Q6 turns "on" rapidly assisted by the speed up action of capacitor C2 thereby turning transistor Q5 "off". It is also noted that the storage elements 18 (FIG. 2) as well as parasitic charge stored in the PMOS transistor Q2 is inherently built up. As will be seen, when the PMOS transistor Q2 is subsequently switched "off", transistor Q6 will turn "off" turning transistor Q5 "on" resulting in the charge being removed through the second switching circuit 24.

When the input pulse at terminal 13 is off and therefore is at ground potential, transistor Q1 goes "off" transistor Q4 goes "off" and transistor Q3 goes "on" turning transistor Q2 "off" removing the +30 volts from the drain or output electrode 20 of transistor 16 thus turning off transistor 16 and thereby terminating the amplified RF at the output electrode 40 to produce the trailing edge of the RF pulse. As noted above, when the PMOS transistor Q2 is subsequently switched "off", transistor Q6 will turn "off" turning transistor Q5 "on" resulting in the charge being removed through the second switching circuit 24.

It is noted that the base of the transistor Q6 is not tied directly to the base of transistor Q1 for the following reasons:
1. The betas of transistors Q1 and Q6 are not guaranteed to be the same therefore one transistor will be "turned on" more than the other one . . . it is possible that only one turns on and the other one would barely turn on. This may render the second switching circuit 24 useless or significantly slow down the first switching circuit 22 so that it does not work as designed; and
2. Without the same speed up capacitor C1, C2 in the resistor divider, R1 and R2 and resistor divider R3 and R4, the turning "on" of Q2 and turning "off" of Q5 (and vice-versa) would not be synchronized. The transistor Q5 of the second switching circuit 24 may turn on or off before the transistor Q2 of the first switching circuit 22 which would cause problems for both circuits 22, 24.

It should be further understood that the diagram in FIG. 2 is simplified and therefore does not include quarter wavelength transmission lines that are used to transform the impedance of the main RF line from a short to an open circuit prior to the bypass capacitors. This is why the bypass capacitors do not short the RF output to ground. The purpose of the simplified diagram in FIG. 2 is to show from a dc point of view the amplifier 12 during the "ON" time of the pulse, all the capacitors charge up. When the +30 volts is removed from the amplifier 12, residual voltage will take some time to discharge because the active devices (i.e., transistor 16 (FIG. 2) switch into an extremely high impedance state (low or no leakage). To remove the voltage from these capacitors and active devices quickly, the second switching circuit 24 (FIG. 3) is provided.

A number of embodiments of the invention have been described. Nevertheless, it will be understood that various modifications may be made without departing from the spirit and scope of the invention. Accordingly, other embodiments are within the scope of the following claims.

What is claimed is:

1. A radio frequency modulator system, comprising:
    a radio frequency amplifier having:
        an amplifier transistor having a control electrode fed by a radio frequency signal, and;
        an energy storage element connected to the RF amplifier transistor;
        wherein the amplifier transistor has an output electrode for producing an amplification of the radio frequency signal when a dc voltage relative to a reference potential is coupled to such output electrode;
    a pulse modulator comprising:
        a first switching circuit response to an input pulse for coupling the dc voltage to the output electrode when the radio frequency signal is to be amplified by the radio frequency amplifier and for decoupling the dc voltage from the output electrode when the radio frequency signal is to be decoupled from the output electrode wherein charge is stored in the storage element when the dc voltage is coupled to the output electrode; and:
        a second switching circuit responsive to the input pulse for discharging the stored charge when the dc voltage is decoupled from the output electrode.

2. The radio frequency modulator recited in claim 1 wherein the first switching circuit comprises:
    a first network fed by the input pulse;
    a first transistor having a control electrode fed by the input pulse through the first network;
    a second transistor having a first electrode coupled to the dc power supply, a second electrode coupled to the output electrode, and a control electrode coupled to an output electrode of the first transistor through the first network; and
    wherein the second switch network comprises:
        a second network;
        a third transistor having a first electrode coupled to the reference potential, a second electrode fed by the input pulse through the second network; and
        a fourth transistor having a first electrode coupled to the reference potential, a second electrode coupled to the output electrode of the amplifier transistor and a control electrode coupled to a third electrode of the third transistor.

3. The radio frequency modulator recited in claim 2 wherein the first transistor is matched to the third transistor.

4. The radio frequency modulator recited in claim 3 wherein the first network has the same configuration as the second network.

5. The radio frequency modulator recited in claim 1 wherein the first switching circuit comprises:
    a first network fed by the input pulse;
    a first transistor having a control electrode fed by the input pulse through the first network;
    a push-pull network; and
    a second transistor having a first electrode coupled to the dc voltage, a second electrode coupled to the output electrode, and a control electrode coupled to the output electrode of the first transistor through the push-pull network; and
    wherein the second switch network comprises:
        a second network; and
        a third transistor having a first electrode coupled to the reference potential, a second electrode fed by the input pulse through the second network;
        a fourth transistor having a first electrode coupled to the reference potential, a second electrode coupled to the output electrode of the amplifier transistor and a control electrode coupled to a third electrode of the third transistor; and
        wherein the first network has the same configuration as the second network.

6. The radio frequency modulator recited in claim 2 wherein the first transistor is matched to the third transistor.

* * * * *

UNITED STATES PATENT AND TRADEMARK OFFICE
CERTIFICATE OF CORRECTION

PATENT NO. : 7,701,308 B1
APPLICATION NO. : 12/267664
DATED : April 20, 2010
INVENTOR(S) : Rodriguez et al.

It is certified that error appears in the above-identified patent and that said Letters Patent is hereby corrected as shown below:

Col. 1, line 6, delete "modulator" and replace with --modulators--.

Col. 1, line 13, delete "system" and replace with --systems--.

Col. 2, line 35, delete "a" and replace with --an--.

Col. 2, line 46, delete "a" and replace with --an--.

Col. 4, line 8, delete "0.35Ω" and replace with --0.3 Ω--.

Col. 4, line 15, delete "sped" and replace with --speed--.

Col. 4, line 18, delete ""+30" and replace with --+30--.

Col. 4, line 27, delete "as parasitic" and replace with --as the parasitic--.

Col. 4, line 44, delete "of the" and replace with --of--.

Col. 4, line 53, delete "capacitor" and replace with --capacitors--.

Col. 4, line 56, delete "vice-versa)" and replace with --vice versa)--.

Signed and Sealed this

Twenty-seventh Day of July, 2010

David J. Kappos
*Director of the United States Patent and Trademark Office*